United States Patent
Chen et al.

(10) Patent No.: US 7,675,318 B2
(45) Date of Patent: Mar. 9, 2010

(54) CONFIGURATION SETTING CIRCUIT AND CONFIGURATION SETTING METHOD THEREOF

(75) Inventors: Chien-Chih Chen, HsinChu (TW); Chi-Shun Weng, HsinChu (TW); Meng-Han Hsieh, HsinChu (TW); Ming-Je Li, HsinChu (TW)

(73) Assignee: Realtek Semiconductor Corp., Hsinchu (TW)

( * ) Notice: Subject to any disclaimer, the term of this patent is extended or adjusted under 35 U.S.C. 154(b) by 39 days.

(21) Appl. No.: 12/025,577

(22) Filed: Feb. 4, 2008

(65) Prior Publication Data

US 2008/0186055 A1   Aug. 7, 2008

(30) Foreign Application Priority Data

Feb. 6, 2007   (TW) ............... 96104251 A (51) Int. Cl.
*H03K 19/173* (2006.01)

(52) U.S. Cl. .............. 326/38; 326/37; 326/39; 326/40; 326/41

(58) Field of Classification Search ............ 327/12, 327/3, 43; 326/37–41, 47, 101; 341/78, 341/79, 141; 370/258
See application file for complete search history.

(56) References Cited

U.S. PATENT DOCUMENTS 6,621,307 B1 * 9/2003 Younis et al. ............. 327/12
6,831,479 B2 * 12/2004 Lo ........................... 326/38

FOREIGN PATENT DOCUMENTS

CN         1639672 A        7/2005
TW         200633381        9/2006

* cited by examiner

*Primary Examiner*—Jean B Jeanglaude
(74) *Attorney, Agent, or Firm*—Quintero Law Office (57) ABSTRACT

A configuration setting circuit and the method thereof, in which the configuration setting circuit includes a clock generator, a plurality of terminals, and a frequency detector coupled to a terminal. The clock generator is used to generate multiple clock signals with different frequencies, and output through the terminals. One input signal is inputted to the frequency detector through the terminal coupled to the frequency detector, so that the frequency detector can output at least two-bit configuration signal corresponding to the frequency of the input signal to set the operation mode.

16 Claims, 8 Drawing Sheets

CONFIGURATION SETTING CIRCUIT AND CONFIGURATION SETTING METHOD THEREOF

CROSS-REFERENCES TO RELATED APPLICATIONS

This non-provisional application claims priority under 35 U.S.C. §119(a) on Patent Application No(s). 096104251 filed in Taiwan, R.O.C. on Feb. 6, 2007, the entire contents of which are hereby incorporated by reference.

FIELD OF INVENTION

The present invention relates to an electric circuit, and particularly to a configuration setting circuit and the configuration setting method thereof.

BACKGROUND OF THE INVENTION

In general, most of integrated circuits (IC) can provide different operation modes to match the user's requirement according to the configuration setting. And the operation mode of an IC is usually configured at the time of IC being turned on or being reset, so as to ensure the IC can be operated at the correct mode. Normally, the configuration setting method of the IC is determined by providing a supply voltage or ground voltage to a specific pin of the IC. Thus, if the operation mode requirements of the IC are increased, the pin counts of the IC will also need to be increased. However, once the more pin counts the IC has, the relative cost of the IC will correspondingly increased. Therefore, how to reduce the pin counts required by the configuration setting of an IC is still a design target for every engineer. The related techniques and research can refer to U.S. Pat. No. 6,831,479 and R.O.C. Patent publication No. 200633381.

SUMMARY OF THE INVENTION

One of the objects of the present invention is to provide a configuration setting circuit and the method thereof, so as to solve the conventional limitations and disadvantages.

One of the objects of the present invention is to provide a configuration setting circuit and the method thereof, so as to reduce the pin counts required in configuration.

According to one embodiment of the present invention, a configuration setting circuit for setting the configuration of an integrated circuit is disclosed. The configuration setting circuit comprising: a clock generator, for generating a plurality of clock signals, wherein the frequencies of the plurality of clock signals are different; a plurality of output terminals, coupled to the clock generator, for respectively outputting the plurality of clock signals; a first input terminal, for receiving a first input signal, wherein the first input signal is one of the plurality of clock signals; and a first frequency detector, coupled to the first input terminal, for detecting the frequency of the first input signal to generate a first configuration data; wherein the first configuration data is an at least two-bit configuration data.

DESCRIPTION OF PREFERRED EMBODIMENTS

The following will provide the embodiments to describe the contents of the present invention in details, and employ the figures as auxiliary description. The symbols referred to in the description are the referral figure numbers.

Figure 1:
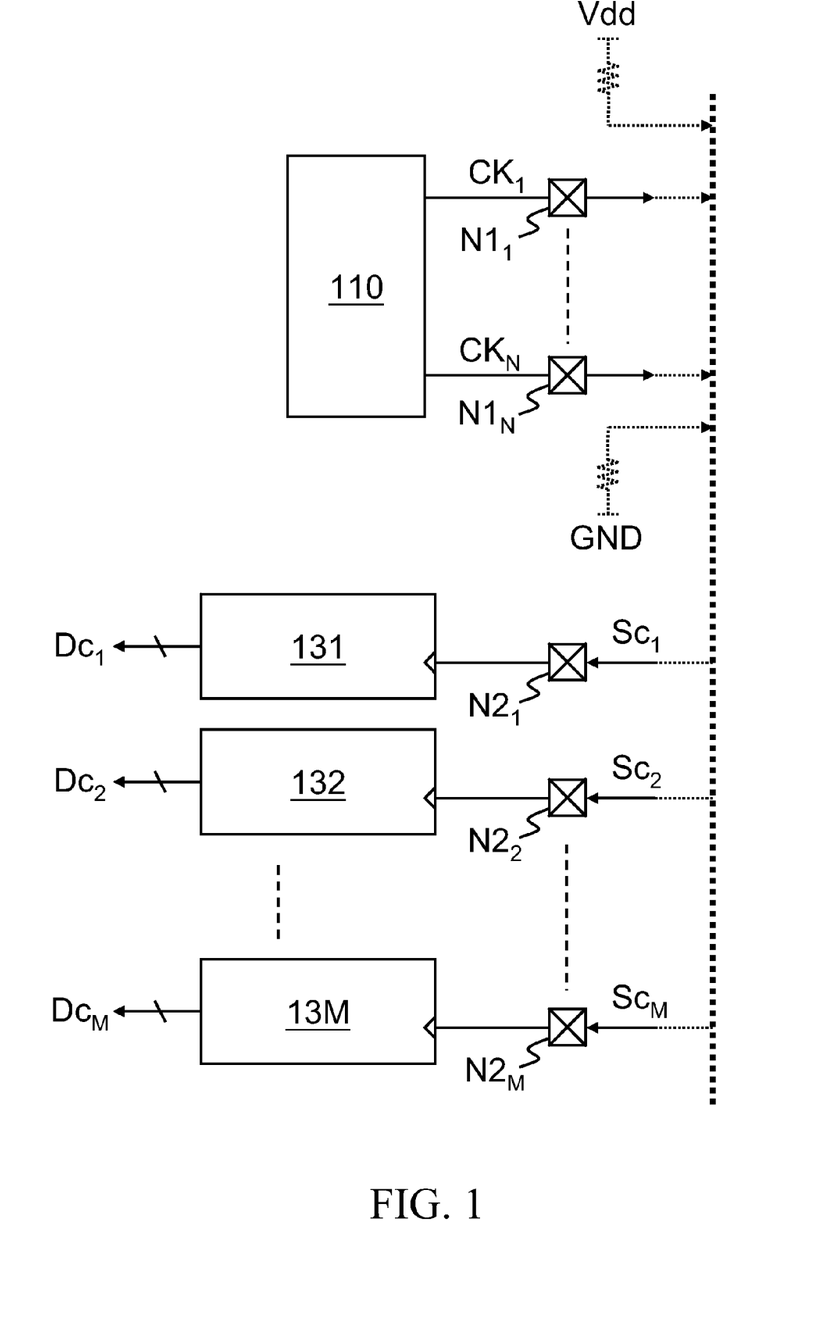
FIG. 1 shows a block diagram of a configuration setting circuit according to first embodiment of the present invention.

Please first refer to FIG. 1, which shows a configuration setting circuit according to the first embodiment of the present invention. The configuration setting circuit is used to generate the configuration data $Dc_1 \sim Dc_M$ for setting the configuration of an IC. The configuration setting circuit includes a clock generator 110, a plurality of terminals $N1_1 \sim N1_N$, $N2_1 \sim N2_M$, such as bonding pads, circuit nodes, etc., and at least one frequency detector 131~13M, wherein N, M are positive integers.

Clock generator 110 is used to generate multiple clock signals $CK_1 \sim CK_N$ with different frequencies. The clock generator 110 is coupled to a plurality of output terminals, $N1_1 \sim N1_N$, and the output terminals $N1_1 \sim N1_N$ respectively outputs the clock signals $CK_1 \sim CK_N$.

Frequency detectors 131~13M are also respectively coupled to input terminals $N2_1 \sim N2_M$. The input terminals $N2_1 \sim N2_M$ respectively receive input signals $Sc_1 \sim Sc_M$; and the frequency detectors 131~13M respectively detect frequencies of input signals $Sc_{1 \sim ScM}$, and output the configuration data $Dc_1 \sim Dc_M$. In other words, the first detector 131 detects the frequency of first input signal $Sc_1$ received at the first input terminal $N2_1$, and generates the first configuration data $Dc_1$ accordingly; the second detector 132 detects the frequency of second input signal $Sc_2$ received at the second input terminal $N2_2$, and generates the second configuration data $DC_2$ accordingly; similarly, the $M^{th}$ detector 13M detects the frequency of $M^{th}$ input signal SCM received at the $M^{th}$ input terminal $N2_M$, and generates the $M^{th}$ configuration data $Dc_M$ accordingly.

Frequency detectors 131~13M outputs the configuration data $Dc_1 \sim Dc_M$ by detecting the frequencies of the input signals $Sc_1 \sim Sc_M$. That is, the configuration data $Dc_M$ outputted by the detector 13M is corresponding to the frequency of the received input signal $Sc_M$.

According to one embodiment of the present invention, input signal $Sc_M$ could be one of the clock signal $CK_N$, a logic high signal Vdd or a logic low signal GN. In another embodiment of the present invention, input signal $Sc_M$ could be one of the four clock signals with different frequencies, such as N=1~4.

Moreover, in one embodiment, input signal $Sc_M$ is one of four different signals, and each of the generated configuration data $Dc_M$ may be the 2-bit configuration data; if there are two frequency detectors configured, such as a first frequency detector 131 and a second frequency detector 132, the first frequency detector 131 and the second frequency detector 132 respectively outputs the first and the second configuration data $Dc_1$, $Dc_2$ in two bits according to the first input signal $Sc_1$ and the second input signal $Sc_2$, so the total configuration data outputted by the configuration setting circuit is a 4-bit data. Of course, if the input signal $Sc_M$ is one of eight different signals, frequency detector 13M can be designed as a 3-bit frequency detector, that is, the configuration data $Dc_M$ generated by frequency detector 13M is a 3-bit configuration data. Furthermore, if there are two detectors being configured, the total configuration data is a 6-bit data. Practically, input signal $Sc_M$ can be designed with $2^K$ different signals and configuration setting circuit can be designed with M numbers of frequency detectors to get K×M bits configuration data. In other words, the integrated circuit can be operated in K×M kinds mode.

In this embodiment, because the clock signals $CK_1$~$CK_N$ have different frequencies, the frequency detectors 131~13M can detect the frequencies of received input signals $Sc_1$~$Sc_M$, and generate the configuration data $Dc_1$~$Dc_M$ accordingly.

Figure 2:
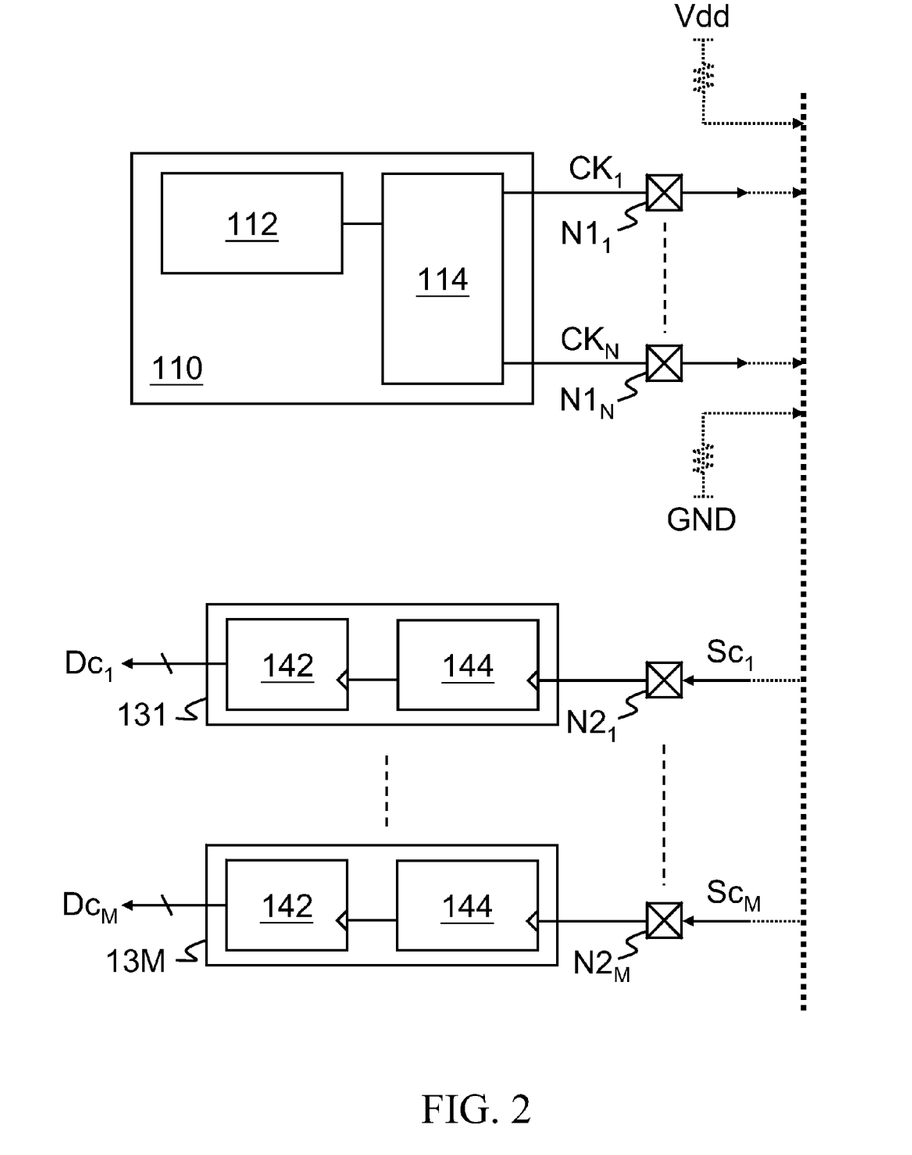
FIG. 2 shows a block diagram of a configuration setting circuit according to second embodiment of the present invention.

According to one embodiment of the present invention, detector 13M may include a counter 142 and a determiner 144 as shown in FIG. 2. The counter 142 is used to count the number of pulses of the input signal $Sc_M$, and to generate a counting result accordingly. The determiner 144 generates the configuration data $Dc_M$ based on the counting result from the counter 142. The determiner 144 may be a slicer for correlating the counting result from the counter 142 with a predetermined period value to generate the configuration data $Dc_M$. Furthermore, the connection sequence for the terminals, the counter and the determiner can be adjusted according to the actual usage requirement.

Figure 3:
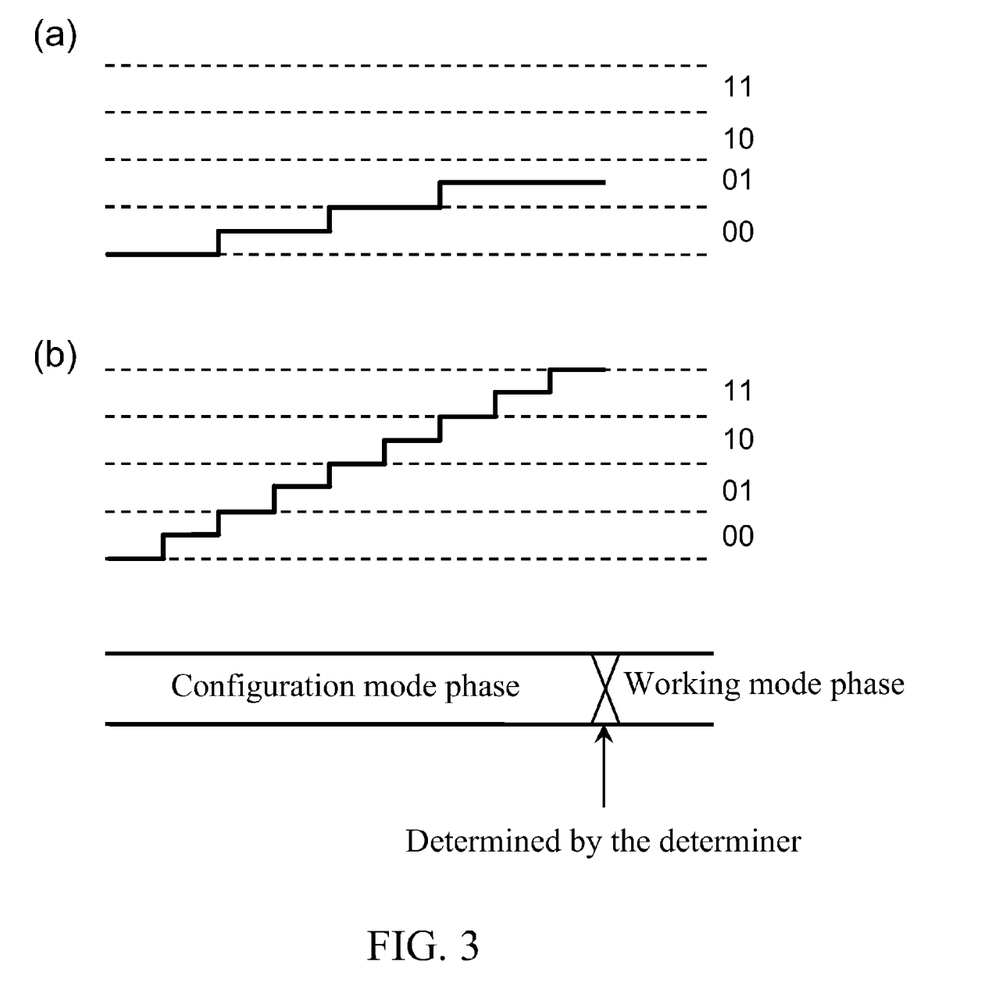
FIG. 3 shows an operation diagram of a determiner according to one embodiment of the present invention.

Please refer to FIG. 3, which shows an operation diagram of the determiner 144. FIG. 3(a) and FIG. 3(b) respectively shows the operation diagrams for the clock signals with two different frequencies. Certainly, if using a logic high signal Vdd or a logic low signal gnd as an input signal $Sc_M$, the detector 13M receiving the input signal $Sc_M$ must be suitably modified its design. In an embodiment, when the determiner 144 detects the counting value for the counter 142 being "0", i.e. the frequency of the input signal $Sc_M$ is substantially equal to zero, which may possibly be a logic high signal Vdd or a logic low signal gnd, the determiner 144 directly outputs the input signal $Sc_M$. In other words, when the input signal $Sc_M$ is a logic high signal Vdd and the configuration data $Dc_M$ is a 2-bit data, the counting value of the counter 142 will be "0", and the outputted configuration data $Dc_M$ will be "11". Similarly, when the input signal $Sc_M$ is a logic low signal gnd and the configuration data $Dc_M$ is a 2-bit data, the counting value of the counter 142 will be "0", and the outputted configuration data $Dc_M$ will be "00".

According to one embodiment of the present invention, the clock generator 110 may include a clock generation unit 112 and a frequency divider 114 as shown in FIG. 2. The clock generation unit 112 generates a reference clock signal to the frequency divider 114, and the frequency divider 114 further generates multiple clock signals $CK_1$~$CK_N$ according to the reference clock signal. The clock generation unit may be an oscillator or a phase lock loop (PLL).

Figure 4:
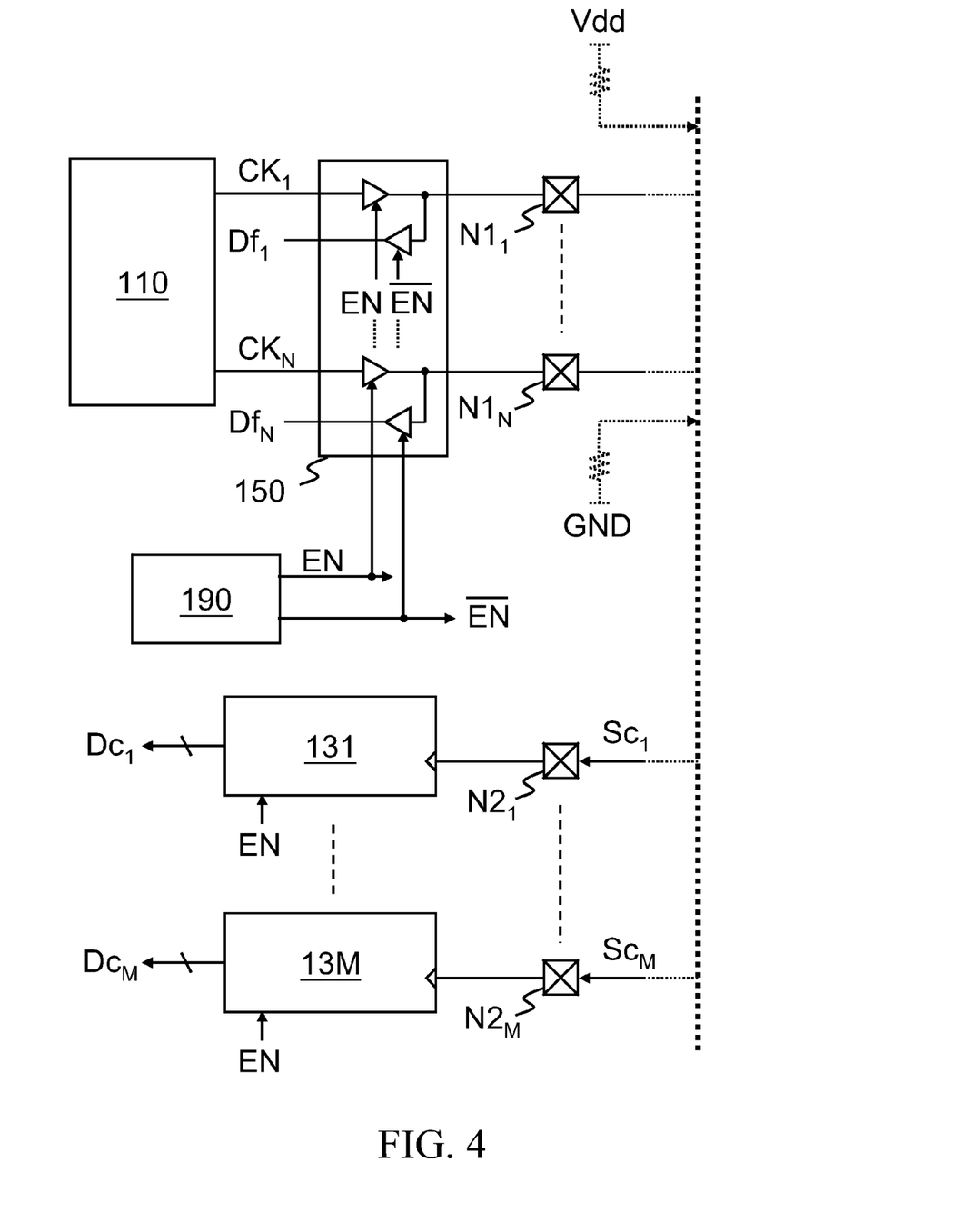
FIG. 4 shows a block diagram of a configuration setting circuit according to third embodiment of the present invention.
Figure 5:
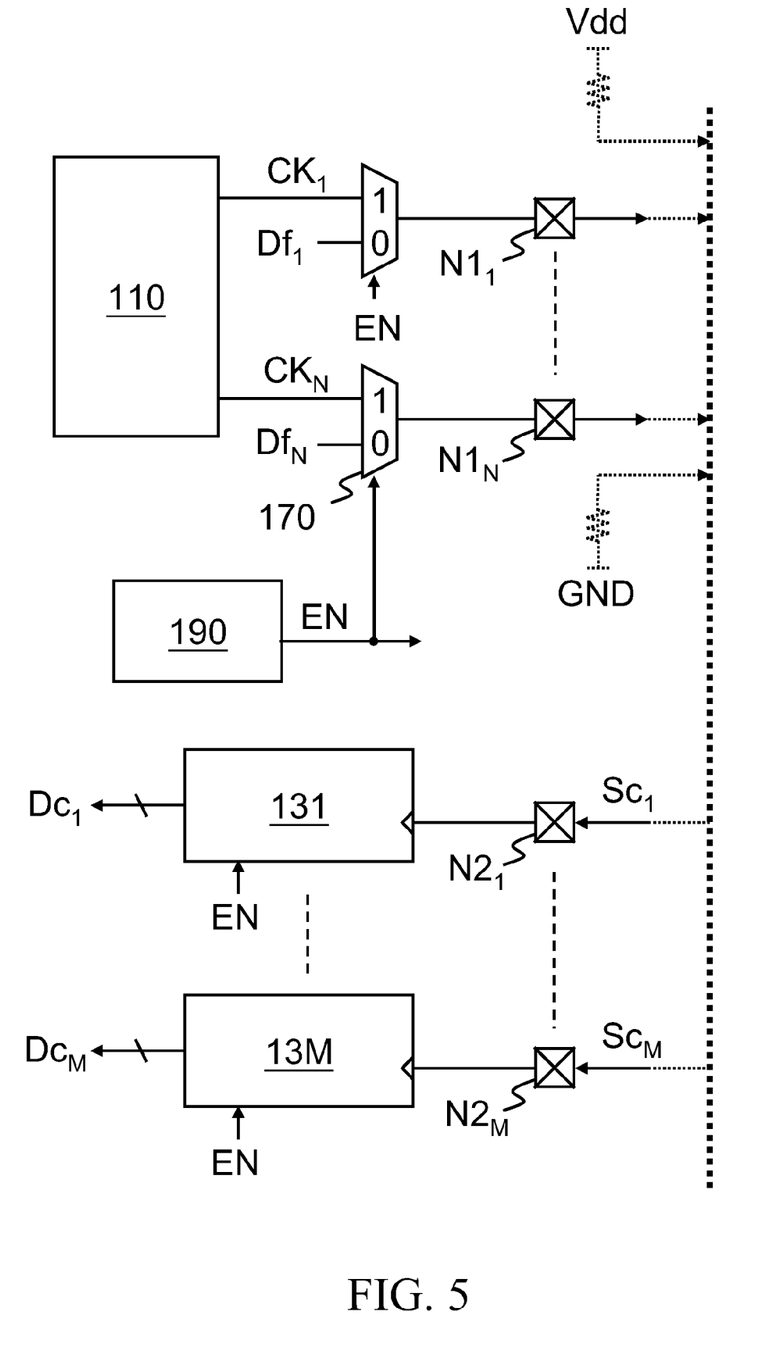
FIG. 5 shows a block diagram of a configuration setting circuit according to fourth embodiment of the present invention.
Figure 6:
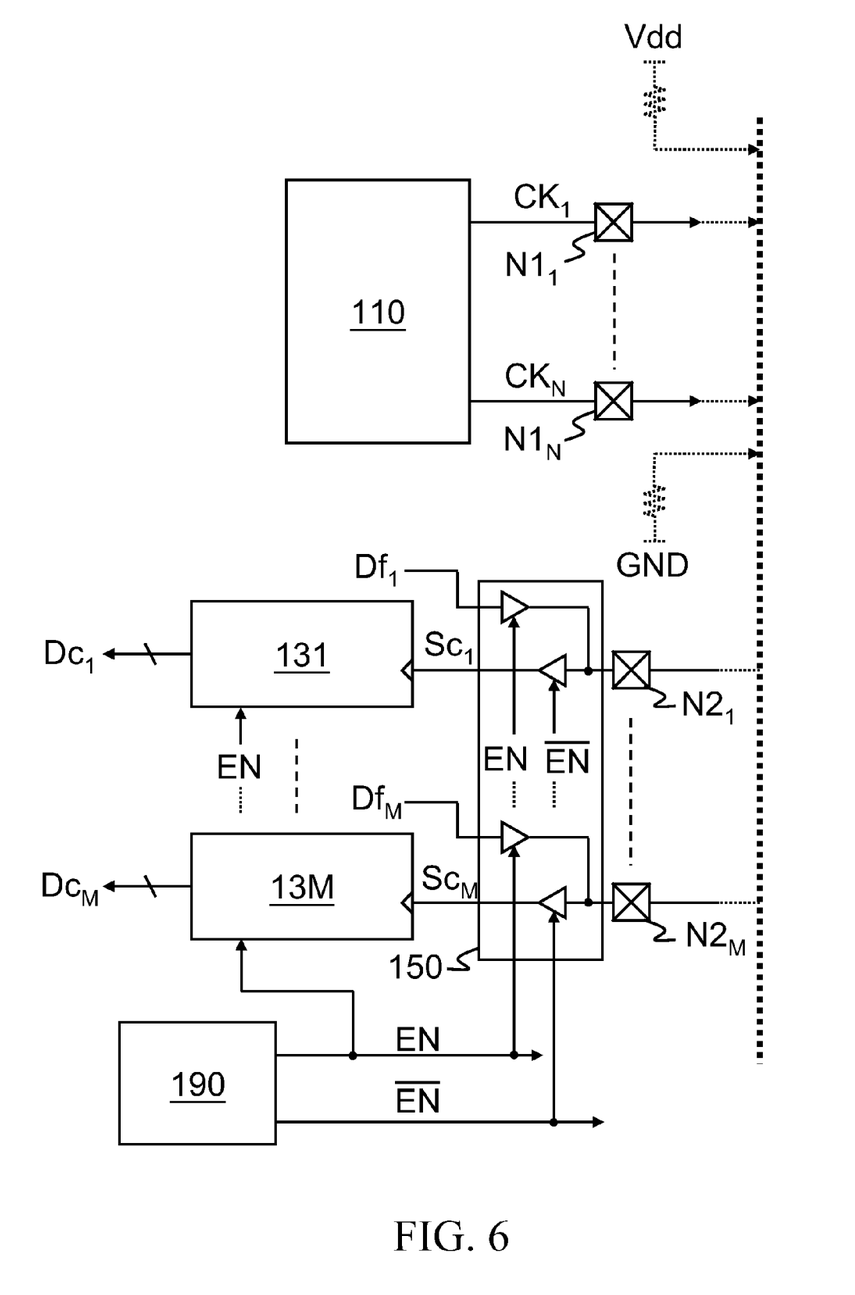
FIG. 6 shows a block diagram of a configuration setting circuit according to fifth embodiment of the present invention.

Furthermore, under the configuration mode and the working mode, the configuration setting circuit of the present invention can share the terminals $N1_1$~$N1_N$ and/or $N2_1$~$N2_M$ for signal transmission, as shown in FIGS. 4, 5 and 6. A selection circuit, such as a switch module 150 or a multiplexer 170, may be used to control the operation of terminals $N1_1$~$N1_N$ and/or $N2_1$~$N2_M$ according to different mode.

Please refer to FIG. 4, which shows the block diagram of the configuration setting circuit according to third embodiment of the present invention. As shown in FIG. 4, the switch module 150 is coupled between the clock generator 110 and the signal terminals $N1_1$~$N1_N$. When the IC is operating in configuration setting mode, the switch module 150 connects the clock generator 110 with the terminals $N1_1$~$N1_N$, so the clock signals $CK_1$~$CK_N$ generated by the clock generator 110 can be outputted through the terminals $N1_1$~$N1_N$. When the IC is operating in normal operation, i.e. under working mode, the switch module 150 connects the associated operation circuit (not shown) with the terminals $N1_1$~$N1_N$, so the data signals $Df_1$~$Df_N$ are transmitted through the terminals $N1_1$~$N1_N$. Similarly, please refer FIG. 5. The operation of the multiplexer 170 is the same as the switch module 150 shown in FIG. 4. That is, when the IC is operating in configuration setting mode, the multiplexer 170 connects the clock generator 110 with the terminals $N1_1$~$N1_N$, so the clock signals $CK_1$~$CK_N$ can be outputted through the terminals $N1_1$~$N1_N$. When the IC is operating in normal operation, i.e. under working mode, the multiplexer 170 connects the associated operation circuit (not shown) with the terminals $N1_1$~$N1_N$, so the data signals $Df_1$~$Df_N$ are transmitted through the terminals $N1_1$~$N1_N$.

Please refer to FIG. 6, which shows a block diagram of the configuration setting circuit according to fifth embodiment of the present invention. As shown in FIG. 6, selection circuit, such as switch module 150 or multiplexer, that can also be coupled between the frequency detectors 131~13M and the terminals $N2_1$~$N2_M$. When the IC is operating in configuration setting mode, the switch module 150 connects the detectors 131~13M with the terminals $N2_1$~$N2_M$, that is, the first detector 131 to the $M^{th}$ detector 13M is connected to the first terminal $N2_1$ to the $M^{th}$ signal terminal $N2_M$, so that the input signal $Sc_M$ is transmitted to the detector 13M through the terminals. When the IC is under the working mode, the switch module 150 connects the associated operation circuit (not shown) with the terminals $N2_1$~$N2_M$, so as to transmit the data signals $Df_1$~$Df_M$ through the terminals $N2_1$~$N2_M$. Similarly, multiplexer can also replace the switch module 150, and the operation of multiplexer is the same as the switch module 150 in FIG. 6.

Please refer to FIGS. 4, 5 and 6 again. Controller 190 can be employed to generate a control signal EN to control the operation of the switch module 150 (or the multiplexer 170). In other words, in the beginning of activating the circuit, i.e. the configuration setting mode, the controller 190 controls the switch module 150 (or the multiplexer 170) to receive the input signal so as to generate configuration data $Dc_1$~$Dc_M$; under the working mode, the controller 190 controls the switch module 150 (or the multiplexer 170), to transmit data signals $Df_1$~$Df_N$/$Df_1$~$Df_M$ through the terminals $N1_1$~$N1_N$/$N2_1$~$N2_M$.

Figure 7:
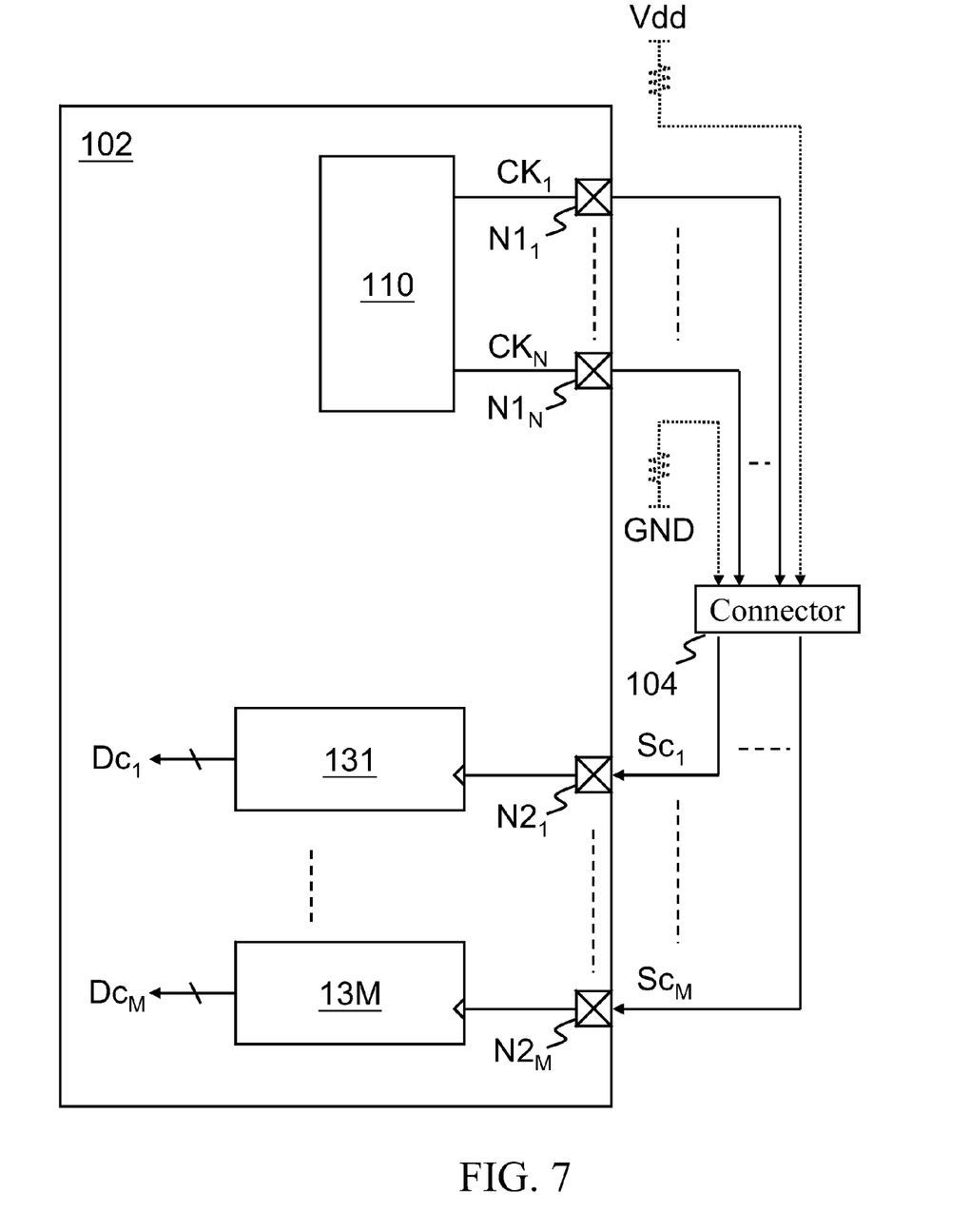
FIG. 7 shows a block diagram of a configuration setting circuit according to sixth embodiment of the present invention.
Figure 8:
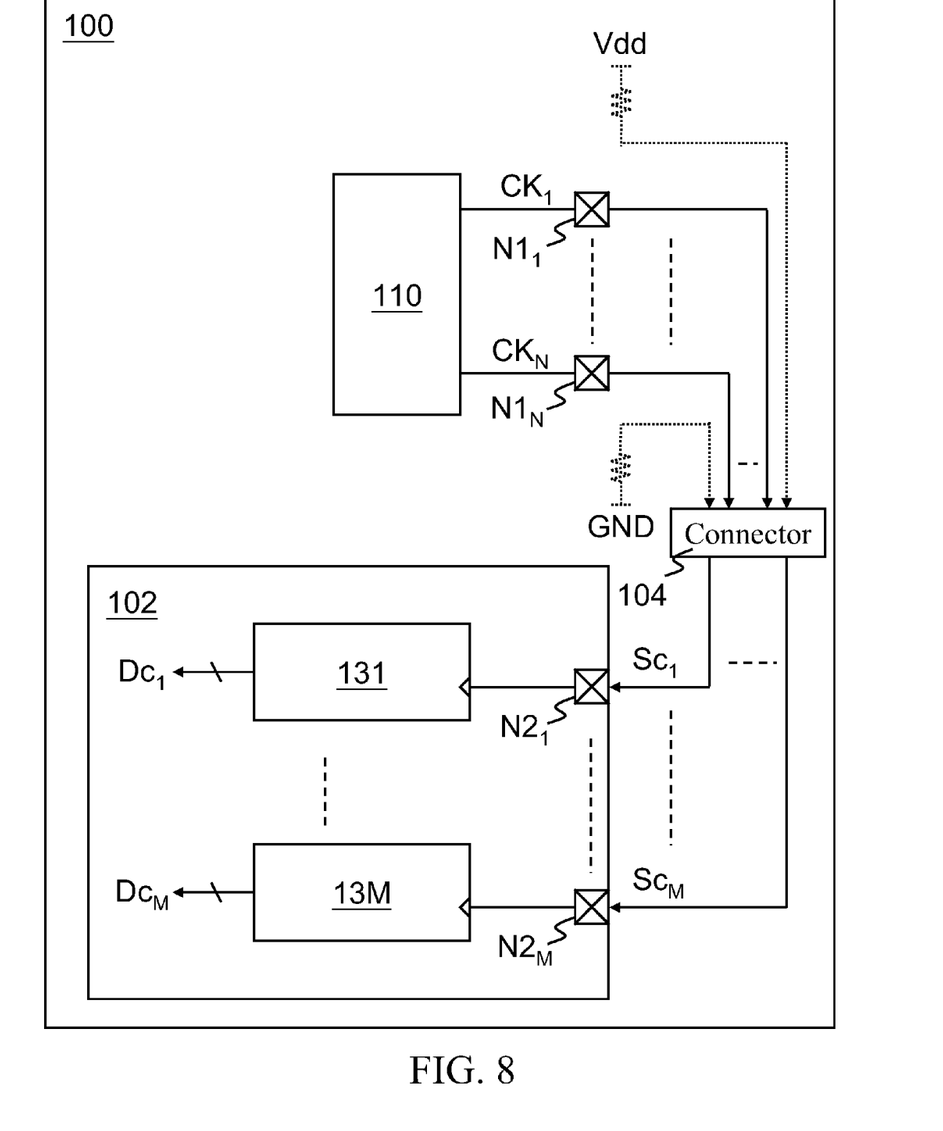
FIG. 8 shows a block diagram of a configuration setting circuit of according to seventh embodiment of the present invention.

According to one embodiment of the present invention, the clock generator 110 and the detector 131~13M are configured within an integrated circuit (IC) 102. The terminals $N1_1$~$N1_N$, $N2_1$~$N2_M$ may be the pins or bonding pads of the IC 102, as shown in FIG. 7. In another embodiment, the detectors 131~13M are located within the IC 102, and the clock generator 110 is located outside the IC 102; that is, the IC 102 and the clock generator 110 are configured on a circuit board 100, as shown in FIG. 8. Herein, the signal terminals $N1_1$~$N1_N$ may be the outputs of the clock generator 110, and the signal terminals $N2_1$~$N2_M$ may be the pins or bonding pads of the IC 102, and employs the connector 104 to make one of the clock signals $CK_1$~$CK_N$, or a high level signal, or a low level signal can be inputted into IC 102. The configuration method is similar to the aforementioned configuration setting circuit, so here is omitted for brevity.

From the above description, it is to be known that the IC can be set in different mode by detecting the frequency of an input signal and can be set over two operation mode only by one configure pin due to the frequency detector can output more than or equal to two bit configuration data. Otherwise, the clock signal for setting the configuration could be generated from the inner of the IC or from the outer of the IC. Furthermore, the configure pin used to configure the IC can be view as a data pin after completing the configuration setting due to the IC adds the skill of pin share. That is, the designer can select one pin of the IC to perform configuration setting when the IC is operating in configuration setting mode and perform data transferring when the IC is operating in working mode (or normal mode) by adding a selection circuit at the selected pin so as to control the pin function.

The technical contents of the present invention have been disclosed with preferred embodiments mentioned as above. However, the disclosed embodiments are not used to limit the present invention. Those proficient in this field may make various changes and modification without departing from the spirit and scope of the present invention, and the changes and modification made thereto are all covered in the scope of the present invention. The protection scope for the present invention should be defined by the attached claims.

What is claimed is:

1. A configuration setting circuit for setting the configuration of an integrated circuit, the configuration setting circuit comprising:
   a clock generator, for generating a plurality of clock signals, wherein the frequencies of the plurality of clock signals are different;
   a plurality of output terminals, coupled to the clock generator, for respectively outputting the plurality of clock signals;
   a first input terminal, for receiving a first input signal, wherein the first input signal is one of the plurality of clock signals; and
   a first frequency detector, coupled to the first input terminal, for detecting the frequency of the first input signal to generate a first configuration data;
   wherein the first configuration data is an at least two-bit configuration data.

2. The configuration setting circuit according to claim 1, further comprises:
   a second input terminal, for receiving a second input signal, wherein the second input signal is one of the plurality of clock signals; and
   a second frequency detector, coupled to the second input terminal, for detecting the frequency of the second input signal to generate a second configuration data;
   wherein the second configuration data is an at least two-bit configuration data; and the configuration data outputted by the configuration setting circuit includes the first configuration data and the second configuration data.

3. The configuration setting circuit according to claim 1, wherein the first frequency detector comprises:
   a counter, for counting the pulse number of the first input signal to generate a counting result; and
   a determiner, for generating the first configuration data based on the counting result.

4. The configuration setting circuit according to claim 1, wherein the clock generator comprises:
   a clock generation unit, for generating a reference clock signal; and
   a frequency divider, coupled to the clock generation unit, for generating the plurality of clock signals based on the reference clock signal.

5. The configuration setting circuit according to claim 1, further comprises:
   a selection circuit, coupled between the output terminal and the clock generator, for determining whether the output terminal outputs the clock signal or not.

6. The configuration setting circuit according to claim 5, wherein the output terminal outputs the clock signal when the integrated circuit is operated in configuration setting mode, and the output a data signal when the integrated circuit is operated in working mode.

7. The configuration setting circuit according to claim 5, wherein the selection circuit is a multiplexer or a switch module.

8. The configuration setting circuit according to claim 1, wherein the clock generator and the first frequency detector are located on one circuit board.

9. The configuration setting circuit according to claim 1, wherein the clock generator and the first frequency detector are configured within the integrated circuit.

10. The configuration setting circuit according to claim 1, wherein the first frequency detector is configured within the integrated circuit, and the clock generator is configured outside the integrated circuit.

11. A configuration setting circuit for setting the configuration of an integrated circuit, the configuration setting circuit comprising:
    a first input terminal, for receiving a first input signal; and
    a first frequency detector, coupled to the first input terminal, for detecting the frequency of the first input signal to generate a first configuration data;
    wherein the first configuration signal is an at least two-bit configuration signal.

12. The configuration setting circuit according to claim 11, further comprises:
    a second input terminal, for receiving a second input signal; and
    a second frequency detector, coupled to the second input terminal, for detecting the frequency of the second input signal to generate a second configuration data;
    wherein the second configuration data is an at least two-bit configuration signal; and the configuration data outputted by the configuration setting circuit includes the first configuration data and the second configuration data.

13. The configuration setting circuit according to claim 11, wherein the first detector comprises:
    a counter, for counting the pulse number of the first input signal to generate a counting result; and
    a determiner, for generating the first configuration data based on the counting result.

14. The configuration setting circuit according to claim 11, further comprises:
    a selection circuit, coupled between the first input terminal and the first detector, for determining whether the first input terminal receives the first input signal or outputs a data signal.

15. The configuration setting circuit according to claim 14, wherein the first input terminal receives the first input signal when the integrated circuit is operated in configuration setting mode; and the first input terminal outputs the data signal when the integrated circuit is operated in working mode.

16. The configuration setting circuit according to claim 11, wherein the first input signal is one of a clock signal, a logic high signal and a logic low signal.

* * * * *